(12) United States Patent
Tsorng et al.

(10) Patent No.: US 12,342,489 B2
(45) Date of Patent: Jun. 24, 2025

(54) ADJUSTABLE BRACKET FOR OPEN FRAME POWER SUPPLY UNIT AND OUTDOOR TELECOMMUNICATIONS SYSTEM INCLUDING SAME

(71) Applicant: Quanta Computer Inc., Taoyuan (TW)

(72) Inventors: Yaw-Tzorng Tsorng, Taoyuan (TW); Ming-Lung Wang, Taoyuan (TW); Hung-Wei Chen, Taoyuan (TW); Tung-Shiun Yang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 289 days.

(21) Appl. No.: 18/127,509

(22) Filed: Mar. 28, 2023

(65) Prior Publication Data
US 2024/0276663 A1    Aug. 15, 2024

Related U.S. Application Data

(60) Provisional application No. 63/485,181, filed on Feb. 15, 2023.

(51) Int. Cl.
H05K 7/14 (2006.01)
F16M 13/02 (2006.01)

(52) U.S. Cl.
CPC ............. *H05K 7/14* (2013.01); *F16M 13/022* (2013.01)

(58) Field of Classification Search
CPC ....... H05K 5/0017; H05K 5/0217; H05K 7/14
(Continued)

(56) References Cited

U.S. PATENT DOCUMENTS

| 7,429,021 B2 * | 9/2008 | Sather | E03C 1/33 |
| | | | 248/200.1 |
| 8,011,628 B1 * | 9/2011 | Suddeth | H01Q 1/12 |
| | | | 248/225.11 |

(Continued)

FOREIGN PATENT DOCUMENTS

| CN | 214376206 U | 10/2021 |
| JP | 2012137924 A | 7/2012 |
| TW | M481579 U | 7/2014 |

OTHER PUBLICATIONS

TW Office Action for Application No. 112120695, mailed Feb. 29, 2024, w/ First Office Action Summary, 6 pp.

(Continued)

*Primary Examiner* — Hung S. Bui

(74) *Attorney, Agent, or Firm* — NIXON PEABODY LLP

(57) ABSTRACT

An adjustable bracket for enclosing an open frame power supply unit (PSU) is disclosed. The adjustable bracket includes a first bracket section having a first primary plate and a first secondary plate extending generally vertically from one end of the first primary plate; and a second bracket section having a second primary plate and a second secondary plate extending generally vertically from one end of the second primary plate, the first secondary plate and the second secondary plate being generally parallel such that the first secondary plate faces the second secondary plate. The second primary plate is movably coupled to the first primary plate such that the adjustable bracket can be in a compact, intermediately extended, or fully extended configuration by adjusting the bracket according to a width of the open frame PSU, the width being different for a first open frame PSU than for a second open frame PSU.

18 Claims, 9 Drawing Sheets

(58) Field of Classification Search
USPC .................................. 361/807, 809, 810
See application file for complete search history.

(56) References Cited

U.S. PATENT DOCUMENTS

| | | | |
|---|---|---|---|
| 10,244,649 B2* | 3/2019 | Anderson, III | H05K 5/0226 |
| 10,411,440 B1* | 9/2019 | Robinson | H02B 1/06 |
| 2024/0260221 A1* | 8/2024 | Tsorng | H05K 7/1487 |

OTHER PUBLICATIONS

TW Search Report for Application No. 112120695, mailed Feb. 29, 2024, w/ First Office Action, 1 pp.

* cited by examiner

ADJUSTABLE BRACKET FOR OPEN FRAME POWER SUPPLY UNIT AND OUTDOOR TELECOMMUNICATIONS SYSTEM INCLUDING SAME

CROSS-REFERENCE TO RELATED APPLICATIONS

This application claims priority from and benefit of U.S. Provisional Patent Application Ser. No. 63/485,181, filed on Feb. 15, 2023, titled "Extendable Bracket For Open Frame Power Supply Unit In Electronic Equipment," which is hereby incorporated by reference herein in its entirety.

FIELD OF THE INVENTION

The present invention relates generally to a bracket for an open frame power supply unit, and more specifically, to an adjustable bracket that can be size-adjusted according to a dimension of the open frame power supply unit mounted in a chassis of electronic equipment.

BACKGROUND OF THE INVENTION

In general, an outdoor electronic equipment, such as an outdoor telecommunications system or a 5G outdoor telecom electronic equipment, has a chassis that is designed for good sealing to achieve the waterproof requirement. Thus, instead of a general power supply unit (PSU), an open frame or fan-less PSU is used in such outdoor electronic equipment for power solution because the chassis is supposed to be impenetrable to the outer environment. That is, if the power supply does not have to have its own housing, an open frame PSU is used. For example, as shown in FIG. 1A, an open frame PSU 100 may consist of a frame without a lid, a simple chassis plate, or even just a separate printed circuit board (PCB), depending on the intended application. The power range is very extensive, and the design of the PSU can also be tailored exclusively to a specific usage.

FIG. 1B shows a chassis 200 generally used in outdoor electronic equipment such as an outdoor 5G telecommunications system. Since various PSUs are usually offered by a variety of different manufacturers, dimensions and/or shapes of the various PSUs may be different. Thus, it may be difficult to accommodate certain open frame PSUs in the same chassis that can accommodate some open frame PSUs. For that reason, modified tooling or customized tool fabrication may need to be designed to the requirements of the chassis 200. Such modifications or customizations of the chassis 200 may be too costly when a specific type of open frame PSU 100 needs to be installed in the chassis 200.

Therefore, a need exists for an adjustable bracket for an open frame PSU, allowing installation of an open frame PSU in a chassis regardless of its dimension and/or shape, without requiring modification of the chassis. A need also exists for a mechanism allowing easy installation of the open frame PSU in the chassis of electronic equipment.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

In view of the above-described problem with the conventional way of mounting various types and sizes of open frame PSUs in a chassis of electronic equipment that may require modifications or customizations of the chassis, the present application discloses an adjustable PSU bracket enclosing the open frame PSU for mounting in the chassis without requiring any modifications or customizations of the chassis.

According to certain aspects of the present disclosure, an outdoor telecommunications system for electronic devices is disclosed. According to various embodiments, the outdoor telecommunications system includes a waterproof chassis for housing the electronic devices, the electronic devices including an open frame power supply unit (PSU), the outdoor telecommunications system further including an adjustable PSU bracket that is configured to enclose the open frame PSU and removably mounted within the waterproof chassis. According to various embodiments, the adjustable PSU bracket includes a first bracket section having a first primary plate and a first secondary plate extending generally perpendicular from one end of the first primary plate, a second bracket section having a second primary plate and a second secondary plate extending generally perpendicular from one end of the second primary plate. The first secondary plate and the second secondary plate are generally parallel such that the first secondary plate faces the second secondary plate. The second primary plate is movably coupled to the first primary plate such that a distance between the first secondary plate and the second secondary plate is adjustable according to a width of the open frame PSU, the width being different for a first open frame PSU than for a second open frame PSU.

In various embodiments, the adjustable PSU bracket further includes a first pair of foot mounts movably coupled to the first secondary plate, and a second pair of foot mounts movably coupled to the second secondary plate. In some embodiments, each of the first pair of foot mounts and the second pair of foot mounts is configured to be coupled to a bottom plate of the chassis.

In various embodiments, each of the first pair of foot mounts and the second pair of foot mounts is movable with respect to a corresponding one of the first secondary plate and second secondary plate. A height of the adjustable PSU bracket is adjustable according to a height of the open frame PSU enclosed within the adjustable PSU bracket.

In various embodiments, a first partial portion of the first primary plate overlaps a generally entire portion of the second primary plate when the adjustable PSU bracket is in a compact configuration in which the distance between the first secondary plate and the second secondary plate is minimal.

In various embodiments, a second partial portion of the first primary plate overlaps a first partial portion of the second primary plate when the adjustable PSU bracket is in a fully extended configuration in which the distance between the first secondary plate and the second secondary plate is maximal.

In various embodiments, the second partial portion of the first primary plate is smaller than and included in the first partial portion of the first primary plate.

In various embodiments, the second primary plate is movably coupled to the first primary plate via a coupling element penetrating through a first hole formed on the first primary plate.

In various embodiments, the coupling element further penetrates a second hole formed on the second primary plate and/or is fixed to the second hole. In various embodiments, the second hole is circular, and the first hole is elongated in a first direction corresponding to a respective movement direction between the second primary plate and the first primary plate.

In various embodiments, the coupling element is positioned at a first position of the first hole when the adjustable PSU bracket is in a compact configuration in which the distance between the first secondary plate and the second secondary plate is minimal. In various embodiments, the coupling element is positioned at a second position of the first hole when the adjustable PSU bracket is in a fully extended configuration in which the distance between the first secondary plate and the second secondary plate is maximal.

In various embodiments, the first position of the first hole is at or near a first end of the first hole, and the second position of the first hole is at or near a second end of the first hole that is an opposite end of the first end. In various embodiments, the adjustable PSU bracket has a locking mechanism to place the adjustable PSU bracket in the compact configuration, in the fully extended configuration, or in at least one intermediately extended configuration.

In various embodiments, the locking mechanism includes at least three locking holes formed in a row in the first direction on the first primary plate and a protrusion formed on the second primary plate and configured to be engaged with any one of the at least three locking holes. In various embodiments, the protrusion is insertable into one of the at least three locking holes to place the adjustable PSU bracket in the compact configuration, intermediately extended configuration, or fully extended configuration by causing the protrusion to engage with a first, second, or third locking hole, respectively, among the at least three locking holes.

In various embodiments, each of the at least three locking holes is elongated in a second direction perpendicular to the first direction, and the protrusion has a shape corresponding to a shape of the locking holes.

In various embodiments, the coupling element is positioned at the first position of the first hole, and the protrusion is engaged with the first locking hole when the adjustable PSU bracket is in the compact configuration. In various embodiments, the coupling element is positioned at the second position of the first hole, and the protrusion is engaged with the third locking hole when the adjustable PSU bracket is in the fully extended configuration.

In various embodiments, each of the first secondary plate and the second secondary plate has at least two pairs of holes formed thereon, the at least two pairs of holes including a first pair of holes and a second pair of holes located below the first pair of holes. In various embodiments, each of the first secondary plate and the second secondary plate has a hole configured to receive a second coupling element configured to couple each of the first pair of foot mounts and the second pair of foot mounts to a corresponding one of the first secondary plate and the second secondary plate, the second coupling element passing through a first hole formed on a primary plate of the foot mount.

In various embodiments, each of the first pair of foot mounts and the second pair of foot mounts includes a pair of protrusions protruding from the primary plate of the foot mount and configured to be engaged with any one of the first pair of holes and second pair of holes. In various embodiments, each of the first pair of foot mounts and the second pair of foot mounts further includes a second hole formed on a secondary plate of the foot mount extending generally perpendicular from one end of the primary plate of the foot mount.

In various embodiments, the pair of protrusions is engaged with the first pair of holes when the open frame PSU enclosed in the adjustable PSU bracket has a first height, and the pair of protrusions is engaged with the second pair of holes when the open frame PSU enclosed in the adjustable PSU bracket has a second height that is greater than the first height. In various embodiments, a fastener passes through the second hole formed on the secondary plate of the foot mount and is inserted to a receiving portion formed at the bottom plate of the chassis to couple the adjustable PSU bracket to the chassis.

According to other aspects of the present disclosure, an adjustable bracket is disclosed. The adjustable bracket is configured to enclose an open frame power supply unit (PSU) for mounting within a chassis of an electronic equipment. According to various embodiments, the adjustable bracket includes a first bracket section having a first primary plate and a first secondary plate extending generally vertically from one end of the first primary plate and a second bracket section having a second primary plate and a second secondary plate extending generally vertically from one end of the second primary plate, the first secondary plate and the second secondary plate being generally parallel such that the first secondary plate faces the second secondary plate. According to various embodiments, the second primary plate is movably coupled to the first primary plate such that the adjustable bracket can be in a compact, intermediately extended, or fully extended configuration by adjusting the bracket according to a width of the open frame PSU, the width being different for a first open frame PSU than for a second open frame PSU.

According to various embodiments, the adjustable bracket further includes a first pair of foot mounts movably coupled to the first secondary plate, and a second pair of foot mounts movably coupled to the second secondary plate. According to various embodiments, each of the first pair of foot mounts and the second pair of foot mounts is movable up or down according to a height of the open frame PSU enclosed within the adjustable bracket.

According to various embodiments, the open frame PSU is mounted within the chassis of the electronic equipment by being enclosed in the adjustable bracket. According to various embodiments, each of the first pair of foot mounts and the second pair of foot mounts is configured to be coupled to a bottom plate of the chassis. According to various embodiments, the adjustable bracket is fixed to the open frame PSU enclosed therein via a fastening mechanism with screws passing through holes formed on the first secondary plate and the second secondary plate.

According to other aspects of the present disclosure, a method for mounting an open frame power supply unit (PSU) within a chassis of an electronic equipment is disclosed. According to various embodiments, the method includes enclosing the open frame PSU in an adjustable PSU bracket, a dimension of the adjustable PSU bracket adjusted according to a width and a height of the open frame PSU. The dimension of the adjustable PSU bracket is adjusted in response to at least one of i) moving a second bracket section of the adjustable PSU bracket in a first direction with respect to a first bracket section of the adjustable PSU bracket according to the width of the open frame PSU, the second bracket section movably coupled to the first bracket section or ii) moving a first pair of foot mounts movably coupled to the first bracket section and a second pair of foot mounts movably coupled to the second bracket section in a second direction that is generally perpendicular to the first direction according to the height of the open frame PSU. The method further includes fixing the adjustable PSU bracket to the open frame PSU enclosed therein via a fastening mechanism with screws passing through holes formed on the adjustable PSU bracket and coupling the adjustable PSU bracket with the open frame PSU enclosed therein to a bottom plate of the chassis via a fastening mechanism with screws passing through holes formed on the first and second pairs of foot mounts. At least the width or the height is different for a first open frame PSU than for a second open frame PSU.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

Figure 1A:
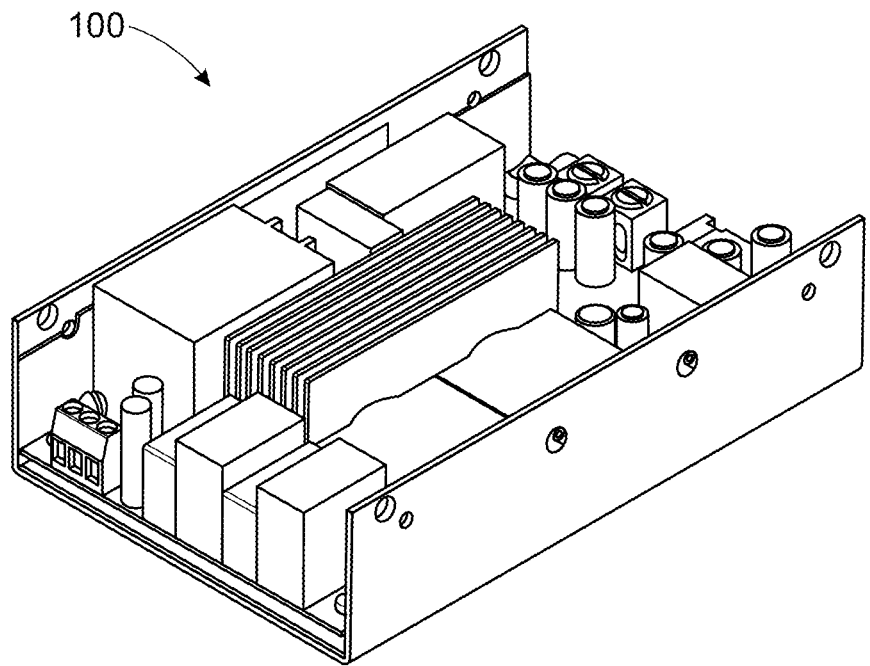
FIG. 1A is a perspective view of an open frame power supply unit (PSU).
Figure 1B:
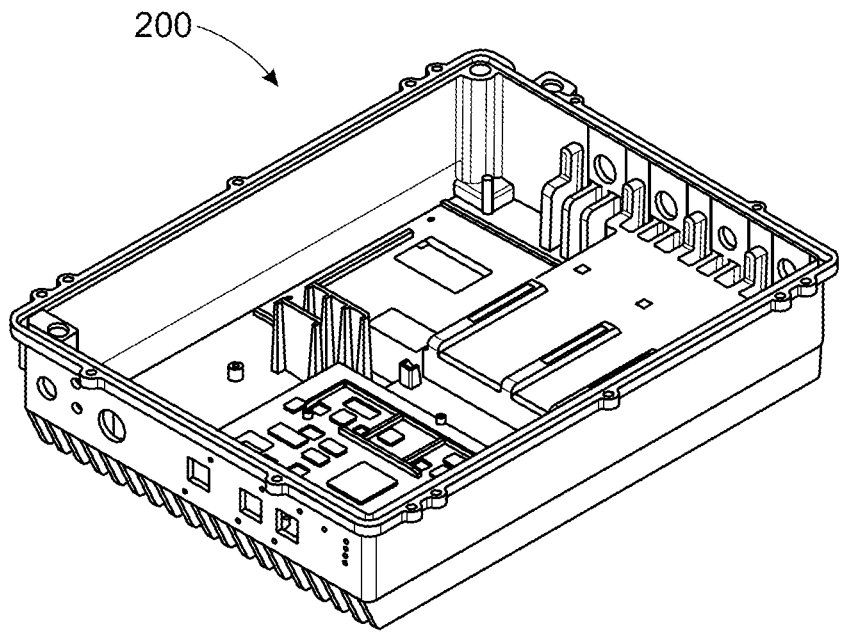
FIG. 1B is a perspective view of a chassis of 5G outdoor electronic equipment.

Elements in the figures are illustrated for simplicity and clarity and have not necessarily been drawn to scale. For example, the dimensions and/or relative positioning of some of the elements in the figures may be exaggerated relative to other elements to help improve understanding of various features.

While the present disclosure is susceptible to various modifications and alternative forms, specific implementations have been shown by way of example in the drawings and will be described in further detail herein. It should be understood, however, that the present disclosure is not intended to be limited to the particular forms disclosed. Rather, the present disclosure is to cover all modifications, equivalents, and alternatives falling within the spirit and scope of the present disclosure as defined by the appended claims.

DETAILED DESCRIPTION

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 2A:
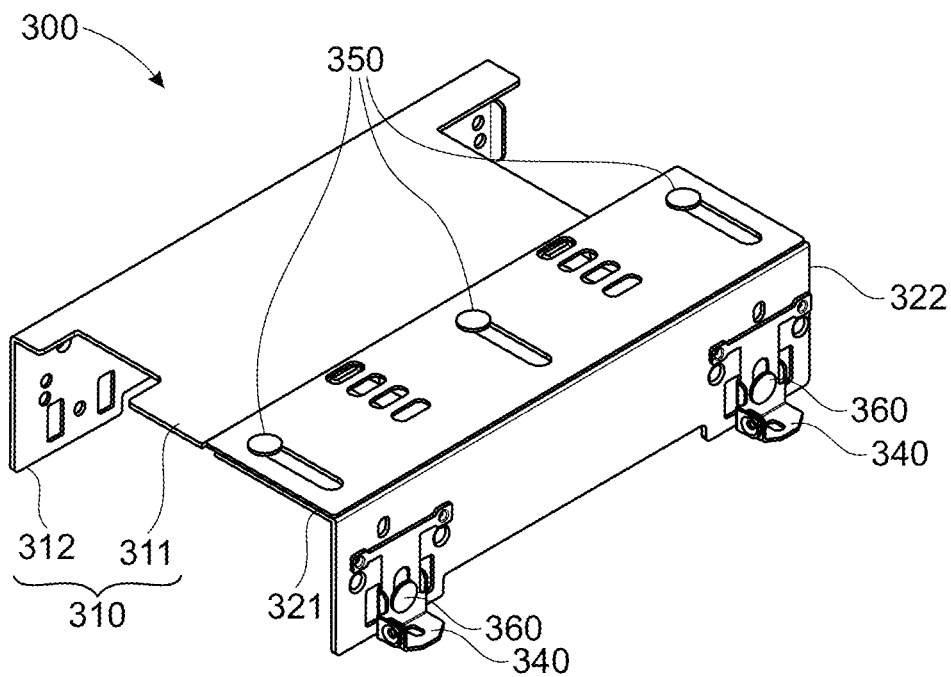
FIGS. 2A and 2B are perspective views of an adjustable open frame PSU bracket, according to certain aspects of the present disclosure.
Figure 2B:
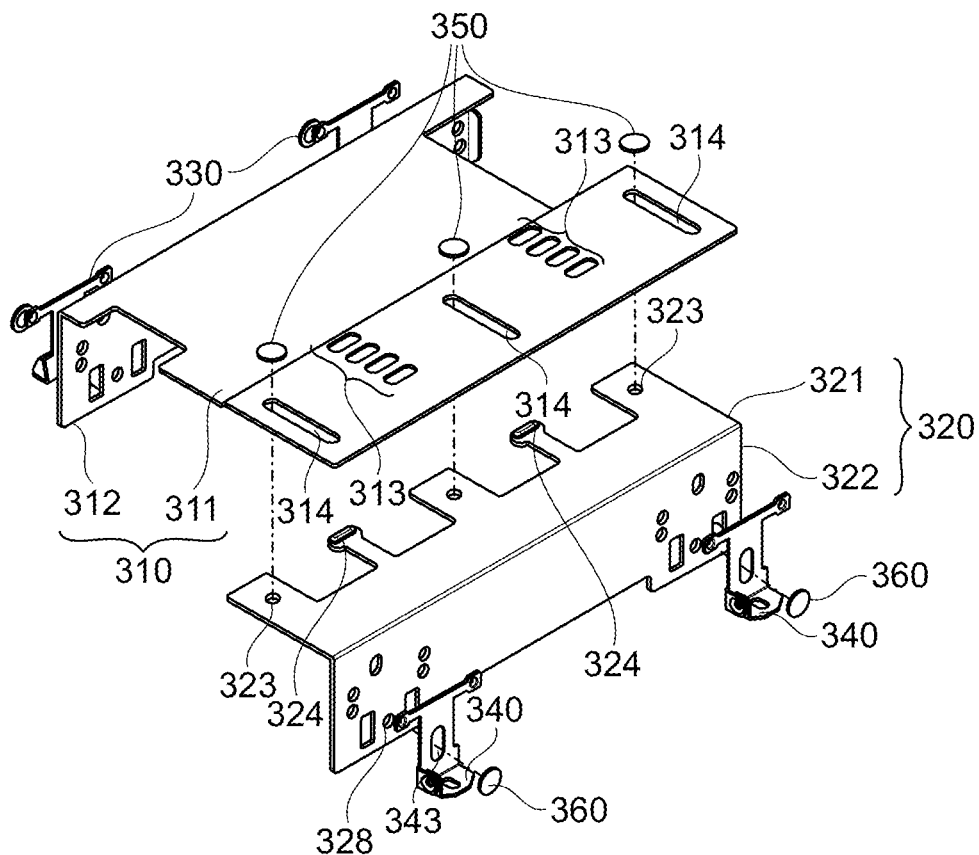

An adjustable PSU bracket 300 according to various embodiments of the present invention is shown in FIGS. 2A and 2B. The adjustable PSU bracket 300 is configured to enclose an open frame power supply unit (PSU) 100 for mounting within a chassis 200 of an electronic equipment. According to various embodiments, the adjustable PSU bracket 300 includes a first bracket section 310 and a second bracket section 320 movably coupled to the first bracket section 310. In some embodiments, the first bracket section 310 and second bracket section 320 are made of metal. In some embodiments, the first bracket section 310 and second bracket section 320 are made of plastic material. The first bracket section 310 has a first primary plate 311 and a first secondary plate 312 extending generally vertically from one end of the first primary plate 311. The second bracket section 320 has a second primary plate 321 and a second secondary plate 322 extending generally vertically from one end of the second primary plate 321. As shown in FIGS. 2A and 2B, the first secondary plate 312 and the second secondary plate 322 are generally parallel such that the first secondary plate 312 faces the second secondary plate 322. In particular, the second primary plate 321 is movably coupled to the first primary plate 311 such that the adjustable PSU bracket 300 can be in a compact, intermediately extended, or fully extended configuration by adjusting the bracket 300 according to a width of the open frame PSU 100. For example, the width is different for a first open frame PSU than for a second open frame PSU, and the width of the adjustable PSU bracket 300 is also different depending on whether the adjustable PSU bracket 300 is adjusted according to the width of the first open frame PSU or the second open frame PSU.

Further referring to FIGS. 2A and 2B, the adjustable PSU bracket 300 further includes a first pair of foot mounts 330 movably coupled to the first secondary plate 312, and a second pair of foot mounts 340 movably coupled to the second secondary plate 322. In some embodiments, the first pair of foot mounts 330 and the second pair of foot mounts 340 are made of metal. Each of the first pair of foot mounts 330 and the second pair of foot mounts 340 is movable up or down according to a height of the open frame PSU 100 enclosed within the adjustable PSU bracket 300. Further, each of the first pair of foot mounts 330 and the second pair of foot mounts 340 is configured to be coupled to a bottom plate 201 of the chassis 200, as shown in FIG. 5F. These features of the first pair of foot mounts 330 and the second pair of foot mounts 340 will be described in more detail, referring to FIGS. 4A, 4B, and 5F.

A first partial portion of the first primary plate 311 overlaps a generally entire portion of the second primary plate 321 when the adjustable PSU bracket 300 is in a compact configuration, as exemplified in FIG. 2A. When the adjustable PSU bracket 300 is in the compact configuration, the distance between the first secondary plate 312 and the second secondary plate 322 is minimal.

Figure 5A:
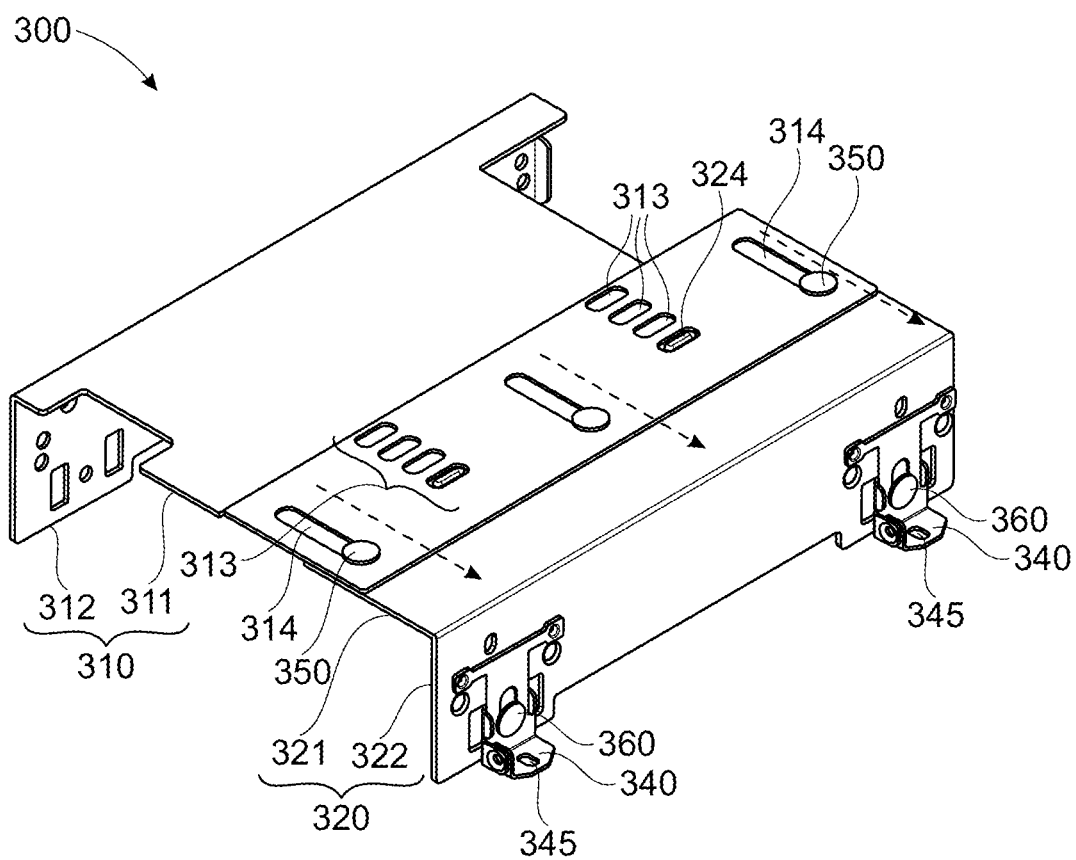
FIGS. 5A, 5B, 5C, 5D, 5E, and 5F show how an adjustable open frame PSU bracket is adjusted to enclose an open frame PSU and how the adjustable PSU bracket with the open frame PSU enclosed therein is mounted to a chassis of 5G outdoor electronic equipment, according to certain aspects of the present disclosure.

A second partial portion of the first primary plate 311 overlaps a first partial portion of the second primary plate 321 when the adjustable PSU bracket 300 is in a fully extended configuration, as exemplified in FIG. 5A. When the adjustable PSU bracket 300 is in the fully extended configuration, the distance between the first secondary plate 312 and the second secondary plate 322 is maximal. The second partial portion of the first primary plate 311 is smaller than the first partial portion of the first primary plate 311. That is, the second partial portion of the first primary plate 311 is included in the first partial portion of the first primary plate 311. See FIGS. 2A and 5A showing the compact configuration and fully extended configuration, respectively. Thus, the adjustable PSU bracket 300 can be adjusted to enclose any open frame PSU 100 as long as the width of the open frame PSU 100 is within the maximal distance between the first secondary plate 312 and the second secondary plate 322.

Further referring to FIGS. 2A and 2B, the second primary plate 321 is movably coupled to the first primary plate 311 via a first coupling element 350 penetrating a first hole 314 formed on the first primary plate 311. In some embodiments, the first coupling element 350 is made of metal. For example, each of the number of the first coupling element 350 and the number of the corresponding first hole 314 is 2, 3, or 4. In the exemplary adjustable PSU bracket 300 shown in FIGS. 2A and 2B, there are 3 first coupling elements 350 penetrating 3 first holes 314. In some embodiments, the first coupling element 350 further penetrates a second hole 323 formed on the second primary plate 321. In some embodiments, the first coupling element 350 is fixed to the second hole 323. In some embodiments, the first coupling element 350 has two sides, the two sides including a first side or external side that is exposed externally, as shown in FIGS. 2A and 2B, and a second side or internal side that is located underneath the first primary plate 311, and thus, not visible externally (not shown in drawings). A space is formed between the first side and the second side such that the periphery of the first hole 314 is placed within the space. The space allows the first coupling element 350 to move within the first hole 314 when the second bracket section 320 moves with respect to the first bracket section 310.

As exemplified in FIG. 2B, in some embodiments, the second hole 323 is circular. Further, as exemplified in FIG. 2B, in various embodiments, the first hole 314 is elongated in a first direction corresponding to a respective movement direction between the second primary plate 321 and the first primary plate 311.

Referring to FIG. 2A, in various embodiments, the first coupling element 350 is positioned at a first position of the first hole 314 when the adjustable PSU bracket 300 is in the compact configuration in which the distance between the first secondary plate 312 and the second secondary plate 322 is minimal. Further, referring to FIG. 5A, the first coupling element 350 is positioned at a second position of the first hole 314 when the adjustable PSU bracket 300 is in the fully extended configuration in which the distance between the first secondary plate 312 and the second secondary plate 322 is maximal. For example, the first position of the first hole 314 is at or near a first end of the first hole 314, and the second position of the first hole 314 is at or near a second end of the first hole 314, the second end being an opposite end of the first end.

Figure 3:
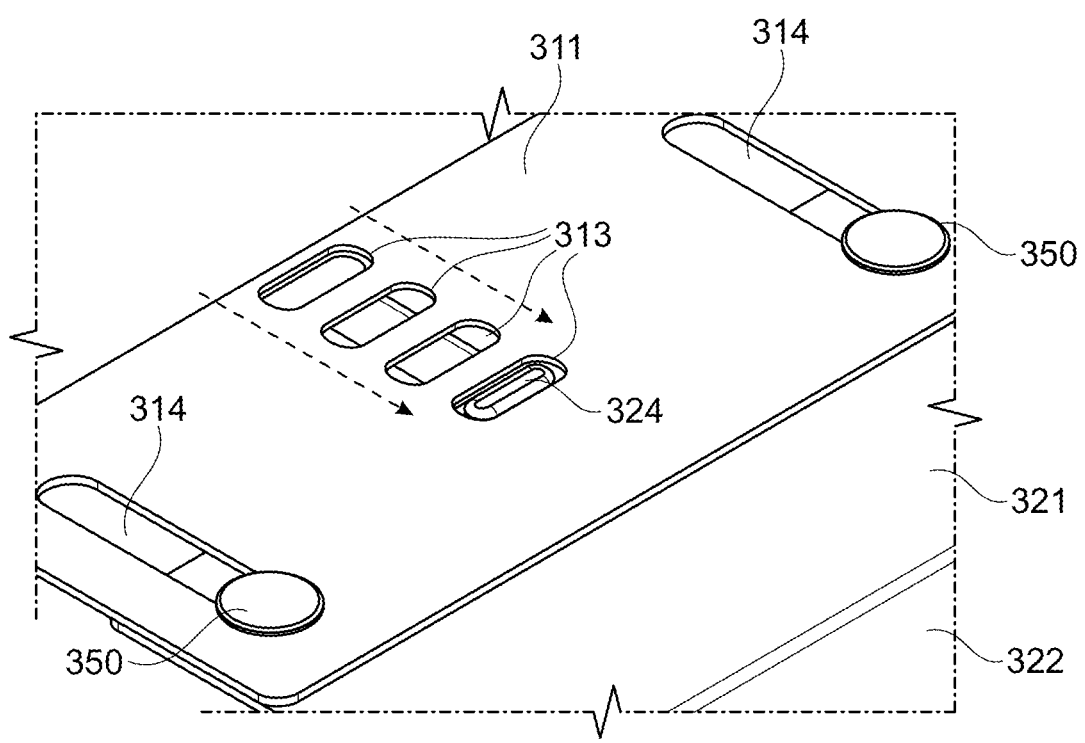
FIG. 3 is a magnified view of a portion of the adjustable open frame PSU bracket shown in FIGS. 2A and 2B, according to certain aspects of the present disclosure.

Referring to FIGS. 2A and 2B and FIG. 3, the adjustable PSU bracket 300 has a locking mechanism to place the adjustable PSU bracket 300 in the compact configuration, in the fully extended configuration, or in at least one intermediately extended configuration. In various embodiments, the locking mechanism includes at least three locking holes 313 formed in a row in the first direction on the first primary plate 311. For example, there are four locking holes 313 formed on the first primary plate 311, as shown in FIGS. 2A, 2B, and 3.

Further, a protrusion 324 is formed on the second primary plate 321, as shown in FIG. 2B. The protrusion 324 is configured to be engaged with any one of the locking holes 313. That is, the protrusion 324 is insertable into one of the locking holes 313 to place the adjustable PSU bracket 300 in the compact configuration, intermediately extended configuration, or fully extended configuration. For example, the protrusion 324 engages with a first, second, third, or fourth locking hole 313 to place the adjustable PSU bracket 300 in the compact configuration, first intermediately extended configuration, second intermediately extended configuration, or fully extended configuration, respectively. In FIGS. 2A, 5C, and 5D, the protrusion 324 is engaged in the first locking hole 313, thus placing the adjustable PSU bracket 300 in the compact configuration. In FIGS. 3 and 5A, the protrusion 324 is engaged in the fourth locking hole 313, thus placing the adjustable PSU bracket 300 in the fully extended configuration.

Referring to FIG. 3, in some embodiments, in contrast to the first hole 314 elongated in the first direction, each of the locking holes 313 is elongated in a second direction perpendicular to the first direction. Further, the protrusion 324 has a shape corresponding to a shape of the locking holes 313. The protrusion 324 is also sized to fit in any one of the locking holes 313.

Figure 4A:
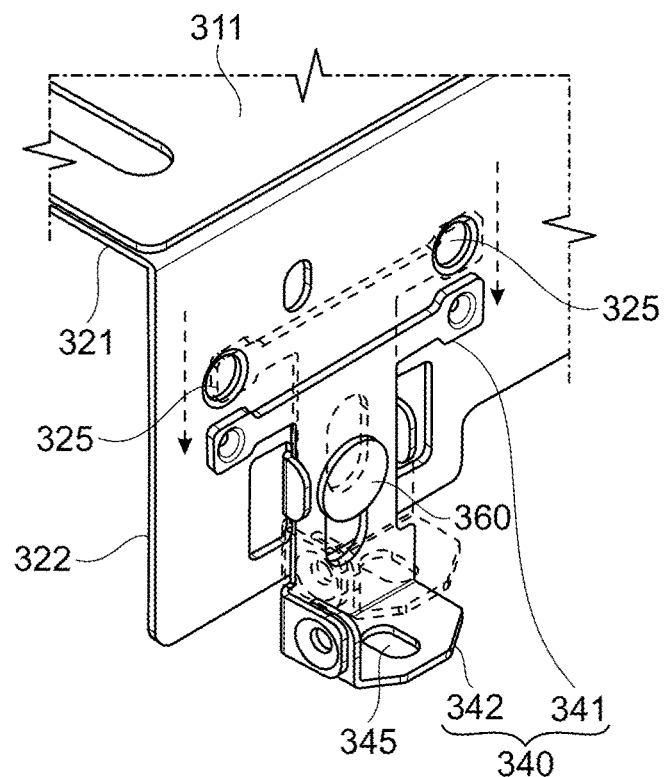
FIGS. 4A and 4B are magnified views of a portion of the adjustable open frame PSU bracket shown in FIGS. 2A and 2B, according to certain aspects of the present disclosure.
Figure 4B:
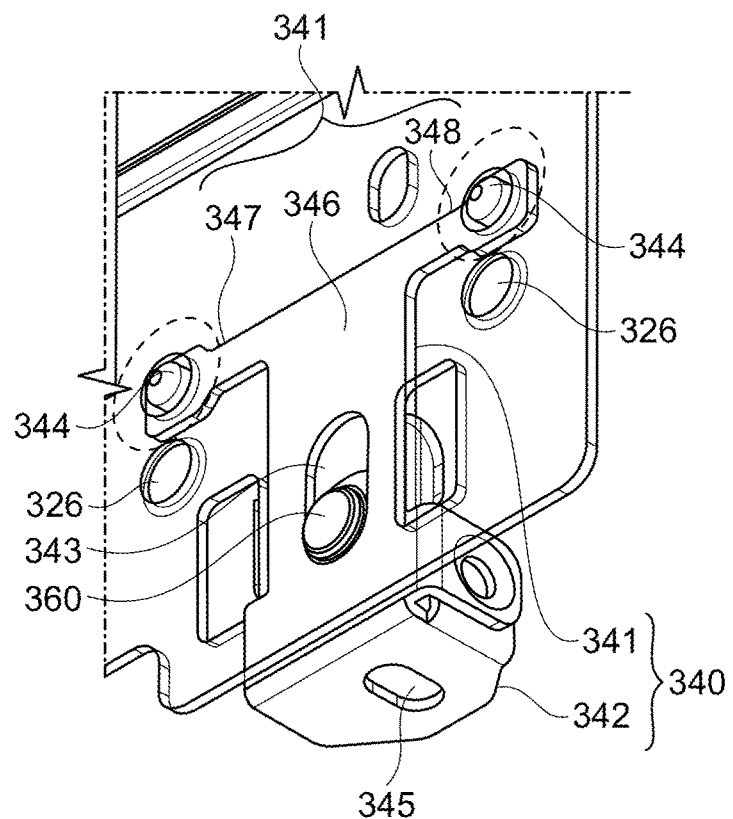

Referring to FIGS. 4A and 4B, each of the first pair of foot mounts 330 and the second pair of foot mounts 340 is movable with respect to a corresponding one of the first secondary plate 312 and second secondary plate 322. Thus, a height of the adjustable PSU bracket 300 is adjustable according to a height of the open frame PSU 100 enclosed within the adjustable PSU bracket 300. Each of the first secondary plate 312 and the second secondary plate 322 has at least two pairs of holes formed thereon, the at least two pairs of holes including a first pair of holes 325 and a second pair of holes 326 located below the first pair of holes 325, respectively.

Referring to FIG. 4B, each of the first secondary plate 312 and the second secondary plate 322 further has a third hole 328 (shown in FIG. 2B) configured to receive a second coupling element 360 configured to couple each of the first pair of foot mounts 330 and the second pair of foot mounts 340 to a corresponding one of the first secondary plate 312 and the second secondary plate 322. In some embodiments, the second coupling element 360 is made of metal. Each of the first pair of foot mounts 330 and the second pair of foot mounts 340 has a hole 343. As shown in FIG. 2B, the second coupling element 360 passes through the hole 343 of the foot mount 330/340 and the third hole 328 to couple the foot mount 330/340 to the first or second secondary plate 312/322. For example, the hole 343 is elongated such that each of the first pair of foot mounts 330 and the second pair of foot mounts 340 is movable with respect to the second coupling element 360 fixed to the third hole 328. In some embodiments, the second coupling element 360 is same as the first coupling element 350. In particular, the second coupling element 360 passes through the hole 343 formed on a primary plate 341 of the foot mount 330/340, as shown in FIG. 4B. Each of the first pair of foot mounts 330 and the second pair of foot mounts 340 includes a pair of protrusions 344 protruding from the primary plate 341 of the foot mount 330/340. As exemplified in FIG. 4A, the foot mount 340 initially engaged with the first pair of holes 325 can be lowered to be engaged with the second pair of holes 326. In FIG. 4B, the foot mount 340 is engaged with the first pair of holes 325, the pair of protrusions 344 being engaged in the first pair of holes 325. In some embodiments, the pair of protrusions 344 serves as Electromagnetic interference (EMI) solution for grounding.

Further, referring to FIGS. 4A and 4B, each of the first pair of foot mounts 330 and the second pair of foot mounts 340 further includes a fourth hole 345 formed on a secondary plate 342 of the foot mount 330/340. The secondary plate 342 extends generally perpendicular from one end of the primary plate 341 of the foot mount 330/340.

According to various embodiments, engagement between the pair of protrusions 344 and the first pair of holes 325 or the second pair of holes 326 is determined based on a height of the open frame PSU 100 enclosed in the adjustable PSU bracket 300. For example, the pair of protrusions 344 is engaged with the first pair of holes 325 when the open frame PSU 100 enclosed in the adjustable PSU bracket 300 has a first height. Further, the pair of protrusions 344 is engaged with the second pair of holes 326 when the open frame PSU 100 enclosed in the adjustable PSU bracket 300 has a second height that is greater than the first height.

Once the height of the adjustable PSU bracket 300 is adjusted by engaging the pair of protrusions 344 with the first pair of holes 325 or the second pair of holes 326, a fastener 390 passes through the fourth hole 345 formed on the secondary plate 342 of the foot mount 330/340. Further, the fastener 390 is inserted to a receiving portion formed at a bottom plate 201 of the chassis 200 to couple the adjustable PSU bracket 300 to the chassis 200, as shown in FIG. 5F. That is, each of the first pair of foot mounts 330 and the second pair of foot mounts 340 is configured to be coupled to the bottom plate 201 of the chassis 200.

Figure 5B:
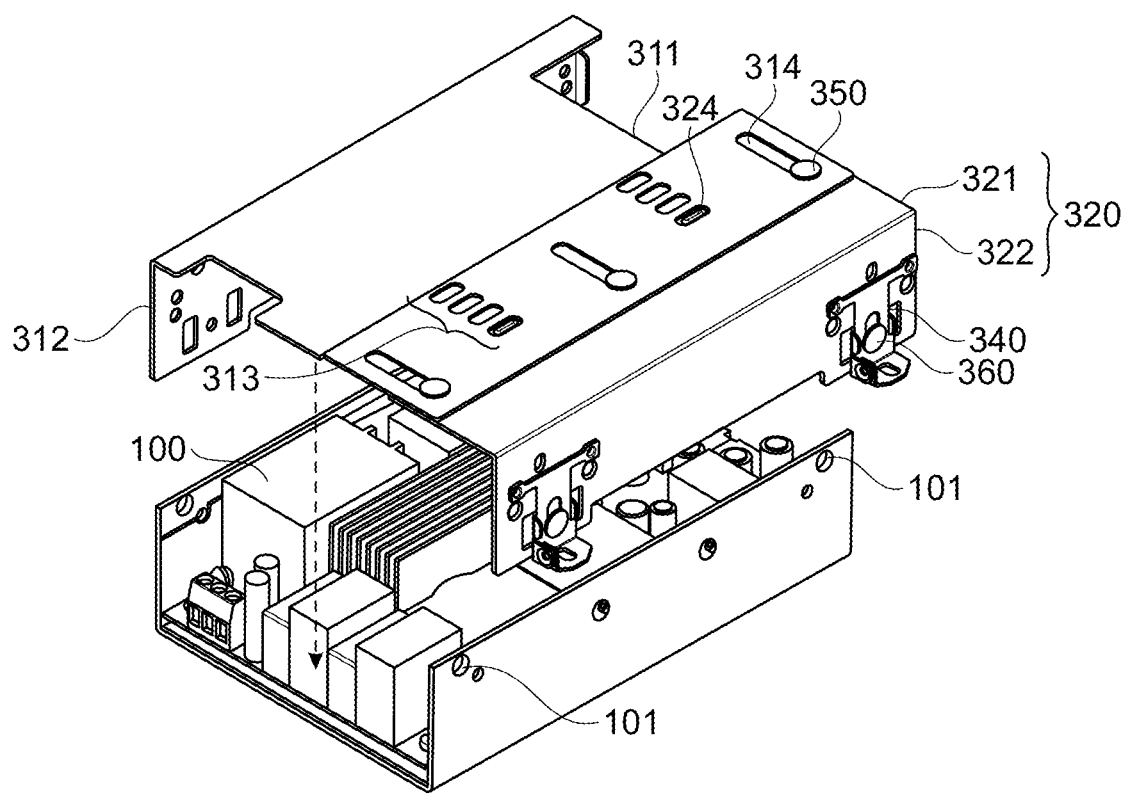
Figure 5C:
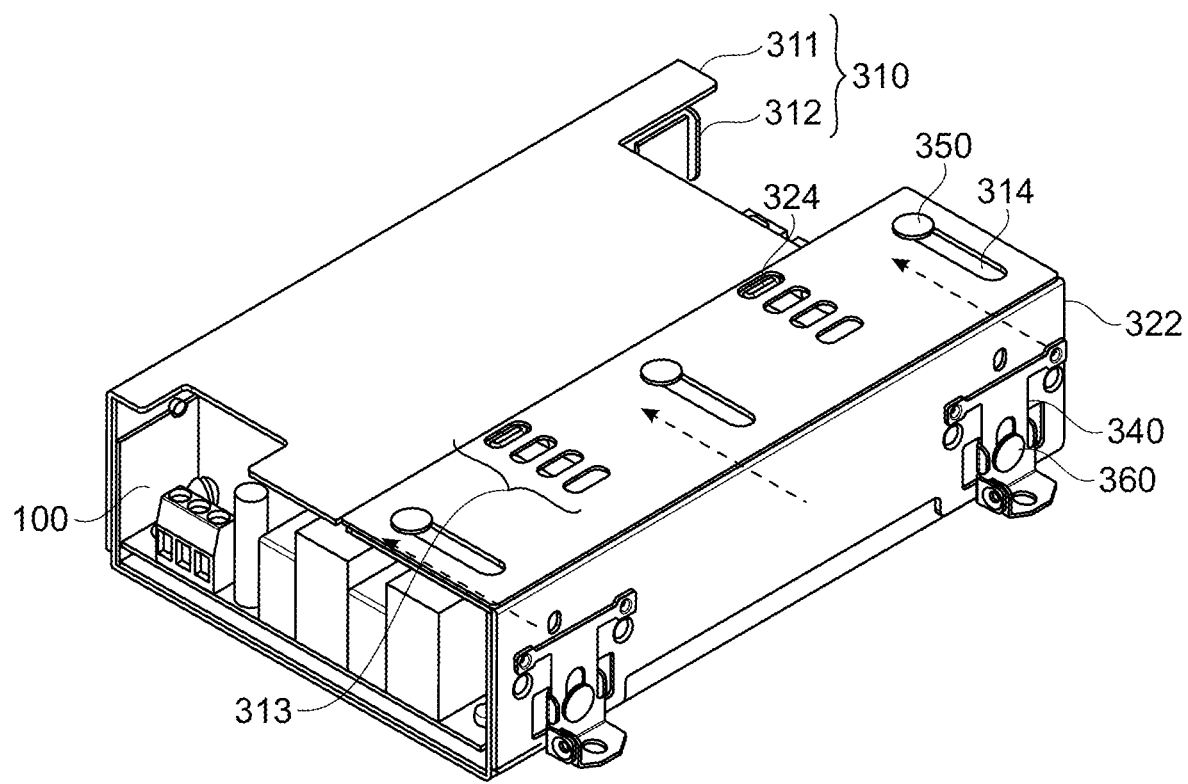
Figure 5D:
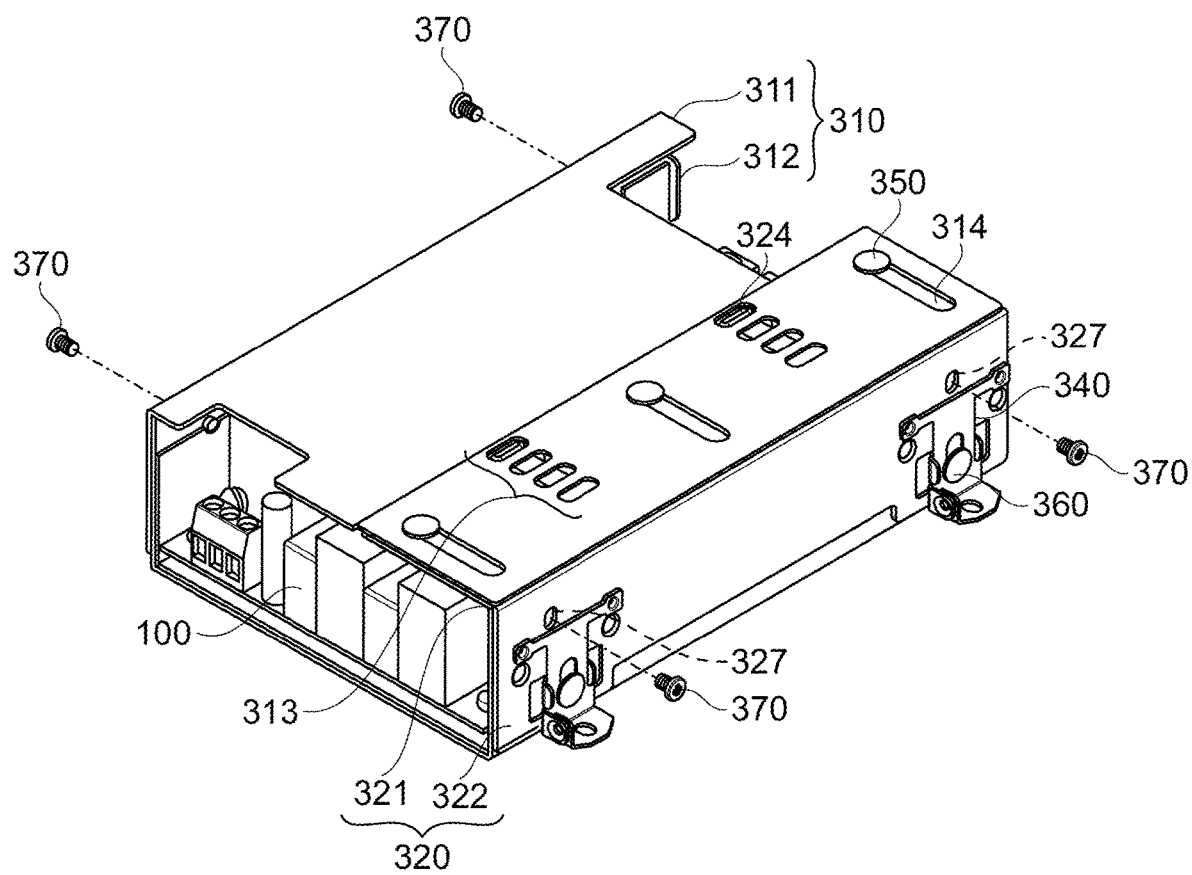
Figure 5E:
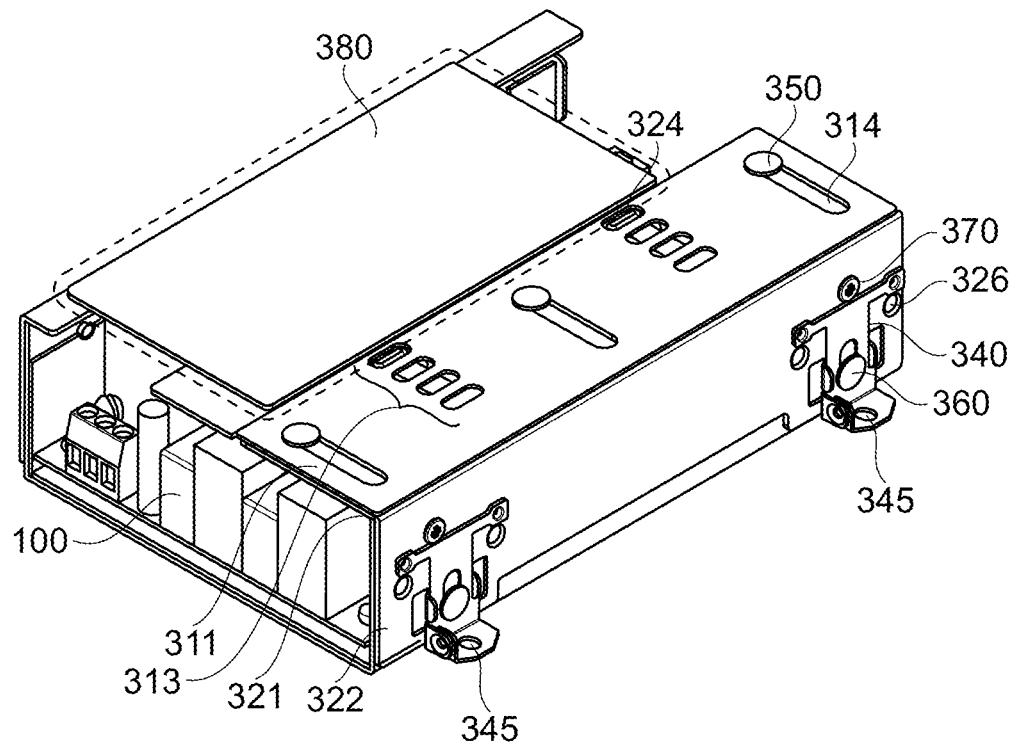
Figure 5F:
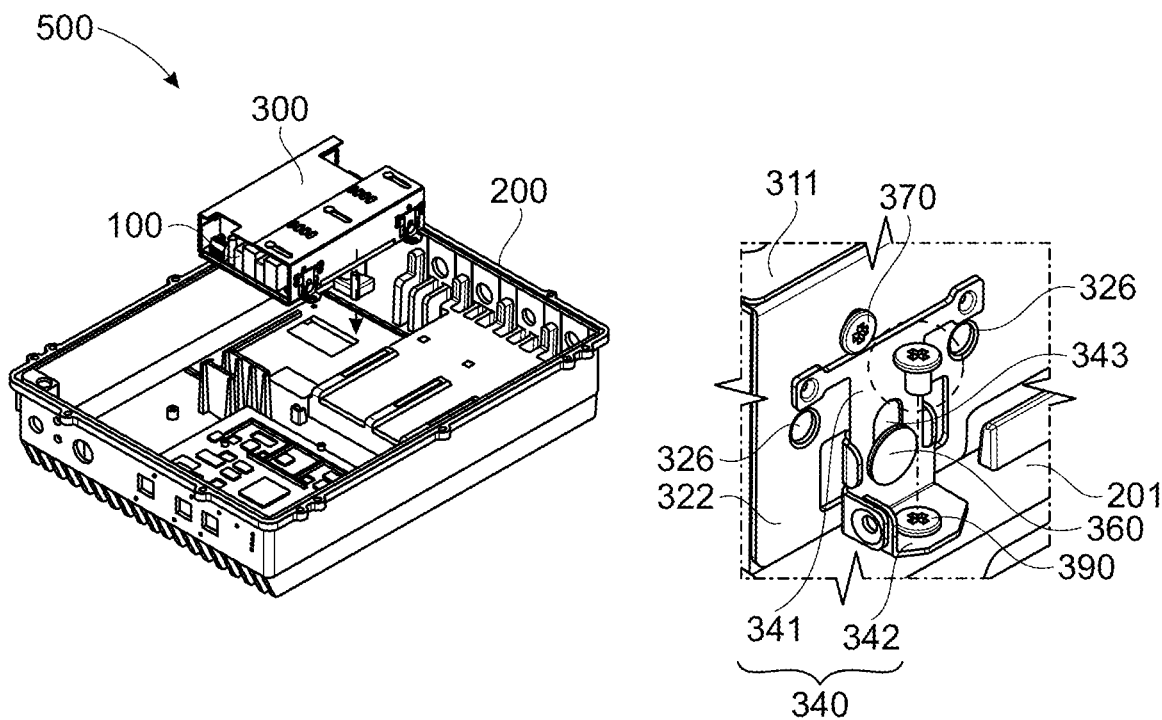

Prior to fixing the foot mounts 330, 340 to the bottom plate 201 of the chassis 200, the adjustable PSU bracket 300 is fixed to the open frame PSU 100 enclosed therein via a fastening mechanism with screws 370 passing through holes 327 formed on the first secondary plate 312 and the second secondary plate 322, as shown in FIGS. 5D and 5E. In some embodiments, the screws 370 passing through respective holes 327 are engaged in respective receiving portions or holes 101 formed on the enclosure of the open frame PSU 100 shown in FIG. 5B. Therefore, the open frame PSU 100 is mounted within the chassis 200 of the electronic equipment 500 by being enclosed in the adjustable PSU bracket 300, as shown in FIG. 5F.

According to various embodiments, an outdoor telecommunications system 500 for electronic devices includes a waterproof chassis 200 for housing the electronic devices, the electronic devices including an open frame power supply unit (PSU) 100, as shown in FIG. 5F. Referring to FIGS. 5B-5F, the outdoor telecommunications system 500 further includes an adjustable PSU bracket 300 configured to enclose the open frame PSU 100 and removably mounted within the waterproof chassis 200.

Referring to FIGS. 2A and 2B, the adjustable PSU bracket 300 includes a first bracket section 310 having a first primary plate 311 and a first secondary plate 312 extending generally perpendicular from one end of the first primary plate 311. The adjustable PSU bracket 300 further includes a second bracket section 320 having a second primary plate 321 and a second secondary plate 322 extending generally perpendicular from one end of the second primary plate 321. The first secondary plate 312 and the second secondary plate 322 are generally parallel such that the first secondary plate 312 faces the second secondary plate 322.

The second primary plate 321 is movably coupled to the first primary plate 311 such that a distance between the first secondary plate 312 and the second secondary plate 322 is adjustable according to a width of the open frame PSU 100. For example, the width is different for a first open frame PSU than for a second open frame PSU, and thus, the distance between the first secondary plate 312 and the second secondary plate 322 of the adjustable PSU bracket 300 is different for the first open frame PSU than for the second open frame PSU.

Referring to FIGS. 5A-5F, a method for mounting an open frame power supply unit (PSU) 100 within a chassis 200 of electronic equipment 500 is described. First, the adjustable PSU bracket 300 is placed in a fully extended configuration, as shown in FIG. 5A. Then, enclose the open frame PSU 100 in the adjustable PSU bracket 300, as shown in FIG. 5B. Further, as exemplified in FIG. 5C, a dimension of the adjustable PSU bracket 300 is adjusted according to the width and height of the open frame PSU 100, for example, by moving the second bracket section 320 with respect to the first bracket section 310. Thus, the adjustable PSU bracket 300 that was in the fully extended configuration, as shown in FIG. 5B, is now in a compact configuration, as shown in FIGS. 5C and 5D.

In particular, the width of the adjustable PSU bracket 300 is adjusted in response to moving the second bracket section 320 of the adjustable PSU bracket 300 in a first direction with respect to the first bracket section 310 of the adjustable PSU bracket 300 according to the width of the open frame PSU 100. If necessary, the height of the adjustable PSU bracket 300 is also adjusted in response to moving the first pair of foot mounts 330 movably coupled to the first bracket section 310 and the second pair of foot mounts 340 movably coupled to the second bracket section in a second direction that is generally perpendicular to the first direction. The adjustment of the adjustable PSU bracket 300 in response to moving the first pair of foot mounts 330 and the second pair of foot mounts 340 is according to the height of the open frame PSU 100.

Then, fix the adjustable PSU bracket 300 to the open frame PSU 100 enclosed therein via a fastening mechanism with screws 370 passing through holes 327 formed on the adjustable PSU bracket 300 and fixed to the receiving portions or holes 101 of the open frame PSU 100, as shown in FIG. 5D. Optionally, a label 380 may be attached to a space provided on the first primary plate 311 of the first bracket section 310, as shown in FIG. 5E. For example, the label 380 includes information such as PSU service information, a model name, an Input/Output location, and/or a cable routing Standard Operating Procedure (SOP).

Then, couple the adjustable PSU bracket 300 with the open frame PSU 100 enclosed therein to a bottom plate 201 of the chassis 200 via a fastening mechanism with fasteners 390 passing through fourth holes 345 formed on the first and second pairs of foot mounts 330, 340, as shown in FIG. 5F.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the disclosure. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this disclosure belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. An outdoor telecommunications system for electronic devices, the outdoor telecommunications system comprising:
   a waterproof chassis for housing the electronic devices, the electronic devices including an open frame power supply unit (PSU); and
   an adjustable PSU bracket configured to enclose the open frame PSU and removably mounted within the waterproof chassis,
   the adjustable PSU bracket including:
   a first bracket section having a first primary plate and a first secondary plate extending generally perpendicular from one end of the first primary plate,
   a second bracket section having a second primary plate and a second secondary plate extending generally perpendicular from one end of the second primary plate, the first secondary plate and the second secondary plate being generally parallel such that the first secondary plate faces the second secondary plate,
   a first pair of foot mounts movably coupled to the first secondary plate, and
   a second pair of foot mounts movably coupled to the second secondary plate,
   wherein the second primary plate is movably coupled to the first primary plate such that a distance between the first secondary plate and the second secondary plate is adjustable according to a width of the open frame PSU, the width being different for a first open frame PSU than for a second open frame PSU, and
   wherein each of the first pair of foot mounts and the second pair of foot mounts is configured to be coupled to a bottom plate of the chassis.

2. The outdoor telecommunications system of claim 1, wherein each of the first pair of foot mounts and the second pair of foot mounts is movable with respect to a corresponding one of the first secondary plate and second secondary plate such that a height of the adjustable PSU bracket is adjustable according to a height of the open frame PSU enclosed within the adjustable PSU bracket.

3. The outdoor telecommunications system of claim 1, wherein a first partial portion of the first primary plate overlaps a generally entire portion of the second primary plate when the adjustable PSU bracket is in a compact configuration in which the distance between the first secondary plate and the second secondary plate is minimal.

4. The outdoor telecommunications system of claim 3, wherein a second partial portion of the first primary plate overlaps a first partial portion of the second primary plate when the adjustable PSU bracket is in a fully extended configuration in which the distance between the first secondary plate and the second secondary plate is maximal.

5. The outdoor telecommunications system of claim 4, wherein the second partial portion of the first primary plate is smaller than and included in the first partial portion of the first primary plate.

6. The outdoor telecommunications system of claim 1, wherein the second primary plate is movably coupled to the first primary plate via a coupling element penetrating through a first hole formed on the first primary plate.

7. The outdoor telecommunications system of claim 6, wherein the coupling element further penetrates a second hole formed on the second primary plate and/or is fixed to the second hole.

8. The outdoor telecommunications system of claim 7, wherein the second hole is circular, and the first hole is elongated in a first direction corresponding to a respective movement direction between the second primary plate and the first primary plate.

9. The outdoor telecommunications system of claim 8, wherein:
the coupling element is positioned at a first position of the first hole when the adjustable PSU bracket is in a compact configuration in which the distance between the first secondary plate and the second secondary plate is minimal; and
the coupling element is positioned at a second position of the first hole when the adjustable PSU bracket is in a fully extended configuration in which the distance between the first secondary plate and the second secondary plate is maximal.

10. The outdoor telecommunications system of claim 9, wherein the first position of the first hole is at or near a first end of the first hole, and the second position of the first hole is at or near a second end of the first hole that is an opposite end of the first end.

11. The outdoor telecommunications system of claim 10, wherein the adjustable PSU bracket has a locking mechanism to place the adjustable PSU bracket in the compact configuration, in the fully extended configuration, or in at least one intermediately extended configuration.

12. The outdoor telecommunications system of claim 11, wherein the locking mechanism includes:
at least three locking holes formed in a row in the first direction on the first primary plate; and
a protrusion formed on the second primary plate and configured to be engaged with any one of the at least three locking holes,
wherein the protrusion is insertable into one of the at least three locking holes to place the adjustable PSU bracket in the compact configuration, intermediately extended configuration, or fully extended configuration by causing the protrusion to engage with a first, second, or third locking hole, respectively, among the at least three locking holes.

13. The outdoor telecommunications system of claim 12, wherein each of the at least three locking holes is elongated in a second direction perpendicular to the first direction, and the protrusion has a shape corresponding to a shape of the locking holes.

14. The outdoor telecommunications system of claim 13, wherein:
the coupling element is positioned at the first position of the first hole, and the protrusion is engaged with the first locking hole when the adjustable PSU bracket is in the compact configuration; and
the coupling element is positioned at the second position of the first hole, and the protrusion is engaged with the third locking hole when the adjustable PSU bracket is in the fully extended configuration.

15. The outdoor telecommunications system of claim 1, wherein:
each of the first secondary plate and the second secondary plate has at least two pairs of holes formed thereon, the at least two pairs of holes including a first pair of holes and a second pair of holes located below the first pair of holes;
each of the first secondary plate and the second secondary plate further has a hole configured to receive a second coupling element configured to couple each of the first pair of foot mounts and the second pair of foot mounts to a corresponding one of the first secondary plate and the second secondary plate, the second coupling element passing through a first hole formed on a primary plate of the foot mount;
each of the first pair of foot mounts and the second pair of foot mounts includes a pair of protrusions protruding from the primary plate of the foot mount and configured to be engaged with any one of the first pair of holes and second pair of holes;
each of the first pair of foot mounts and the second pair of foot mounts further includes a second hole formed on a secondary plate of the foot mount extending generally perpendicular from one end of the primary plate of the foot mount;
the pair of protrusions is engaged with the first pair of holes when the open frame PSU enclosed in the adjustable PSU bracket has a first height, and the pair of protrusions is engaged with the second pair of holes when the open frame PSU enclosed in the adjustable PSU bracket has a second height that is greater than the first height; and
a fastener passes through the second hole formed on the secondary plate of the foot mount and is inserted to a receiving portion formed at the bottom plate of the chassis to couple the adjustable PSU bracket to the chassis.

16. An adjustable bracket configured to enclose an open frame power supply unit (PSU) for mounting within a chassis of an electronic equipment, the adjustable bracket comprising:
a first bracket section having a first primary plate and a first secondary plate extending generally vertically from one end of the first primary plate;
a second bracket section having a second primary plate and a second secondary plate extending generally vertically from one end of the second primary plate, the first secondary plate and the second secondary plate being generally parallel such that the first secondary plate faces the second secondary plate;
a first pair of foot mounts movably coupled to the first secondary plate; and
a second pair of foot mounts movably coupled to the second secondary plate,
wherein the second primary plate is movably coupled to the first primary plate such that the adjustable bracket can be in a compact, intermediately extended, or fully extended configuration by adjusting the bracket according to a width of the open frame PSU, the width being different for a first open frame PSU than for a second open frame PSU,
wherein each of the first pair of foot mounts and the second pair of foot mounts is movable up or down according to a height of the open frame PSU enclosed within the adjustable bracket.

17. The adjustable bracket of claim 16, wherein:
the open frame PSU is mounted within the chassis of the electronic equipment by being enclosed in the adjustable bracket;
each of the first pair of foot mounts and the second pair of foot mounts is configured to be coupled to a bottom plate of the chassis; and
the adjustable bracket is fixed to the open frame PSU enclosed therein via a fastening mechanism with screws passing through holes formed on the first secondary plate and the second secondary plate.

18. A method for mounting an open frame power supply unit (PSU) within a chassis of an electronic equipment, the method comprising:
    enclosing the open frame PSU in an adjustable PSU bracket, a dimension of the adjustable PSU bracket adjusted according to a width and a height of the open frame PSU, the adjustable bracket comprising:
    a first bracket section having a first primary plate and a first secondary plate extending generally vertically from one end of the first primary plate;
    a second bracket section having a second primary plate and a second secondary plate extending generally vertically from one end of the second primary plate, the first secondary plate and the second secondary plate being generally parallel such that the first secondary plate faces the second secondary plate;
    a first pair of foot mounts movably coupled to the first secondary plate; and
    a second pair of foot mounts movably coupled to the second secondary plate,
    wherein the dimension of the adjustable PSU bracket is adjusted in response to at least one of i) moving the second bracket section of the adjustable PSU bracket in a first direction with respect to the first bracket section of the adjustable PSU bracket according to the width of the open frame PSU, the second bracket section movably coupled to the first bracket section or ii) moving the first pair of foot mounts movably coupled to the first bracket section and the second pair of foot mounts movably coupled to the second bracket section in a second direction that is generally perpendicular to the first direction according to the height of the open frame PSU;
    fixing the adjustable PSU bracket to the open frame PSU enclosed therein via a fastening mechanism with screws passing through holes formed on the adjustable PSU bracket; and
    coupling the adjustable PSU bracket with the open frame PSU enclosed therein to a bottom plate of the chassis via a fastening mechanism with screws passing through holes formed on the first and second pairs of foot mounts,
    wherein at least the width or the height is different for a first open frame PSU than for a second open frame PSU.

* * * * *